(12) United States Patent
Tabushi

(10) Patent No.: US 10,477,623 B2
(45) Date of Patent: Nov. 12, 2019

(54) HEATER

(71) Applicant: KYOCERA Corporation, Kyoto-shi, Kyoto (JP)

(72) Inventor: Shouhei Tabushi, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 425 days.

(21) Appl. No.: 15/315,409

(22) PCT Filed: Aug. 28, 2015

(86) PCT No.: PCT/JP2015/074352
§ 371 (c)(1),
(2) Date: Dec. 1, 2016

(87) PCT Pub. No.: WO2016/031951
PCT Pub. Date: Mar. 3, 2016

(65) Prior Publication Data
US 2017/0208649 A1    Jul. 20, 2017

(30) Foreign Application Priority Data

Aug. 29, 2014  (JP) ................................ 2014-174940

(51) Int. Cl.
| H05B 3/12 | (2006.01) |
| H05B 3/16 | (2006.01) |
| H05B 3/74 | (2006.01) |
| H01L 21/67 | (2006.01) |
| H05B 3/26 | (2006.01) |

(52) U.S. Cl.
CPC .......... *H05B 3/12* (2013.01); *H01L 21/67103* (2013.01); *H05B 3/16* (2013.01); *H05B 3/265* (2013.01); *H05B 3/74* (2013.01)

(58) Field of Classification Search
CPC . H05B 3/12; H05B 3/16; H05B 3/265; H05B 3/74; H05B 3/68; H05B 3/50; H01L 21/67103
See application file for complete search history.

(56) References Cited

U.S. PATENT DOCUMENTS

| 2002/0158060 A1* | 10/2002 | Uchiyama | ......... H01L 21/67103 |
| | | | 219/444.1 |
| 2005/0219786 A1* | 10/2005 | Brown | ................ H01L 21/6831 |
| | | | 361/234 |
| 2015/0373783 A1* | 12/2015 | Kitagawa | ................ H05B 3/26 |
| | | | 156/345.52 |

FOREIGN PATENT DOCUMENTS

JP     2001-244057 A     9/2001

* cited by examiner

*Primary Examiner* — Brian W Jennison
(74) *Attorney, Agent, or Firm* — Volpe and Koening, P.C.

(57) ABSTRACT

A heater includes: a base body formed of ceramics; a heat generating resistor layer disposed on a surface of the base body; a conductive layer laminated on the heat generating resistor layer; a plate-like member which is disposed on the conductive layer and is provided with a pair of through holes; and a connection terminal composed of wires which are inserted successively through one of the pair of through holes and the other and are unified at a side of the plate-like member which side is opposite to a side of the plate-like member facing the conductive layer, the connection terminal being electrically connected with the conductive layer.

9 Claims, 3 Drawing Sheets

HEATER

TECHNICAL FIELD

The present invention relates to a heater which is mainly of use for heating a semiconductor wafer.

BACKGROUND ART

In a semiconductor thin film forming step, an etching step, a resist film baking step, or other step to be followed in a semiconductor manufacturing process, a wafer heating apparatus is used to heat a semiconductor wafer (hereafter abbreviated as "wafer"). The wafer heating apparatus is put to use when incorporated in a semiconductor manufacturing apparatus. Examples of such a wafer heating apparatus include a heater disclosed in Japanese Unexamined Patent Publication JP-A 2001-244057 (hereafter referred to as "Patent Literature 1"). The heater disclosed in Patent Literature 1 comprises a heat-equalizing plate formed of ceramics, a $SiO_2$ film formed on the surface of the heat-equalizing plate, a glass-made insulating layer formed on the surface of the $SiO_2$ film, and a heating resistor disposed on the surface of the insulating layer. The heating resistor is electrically connected to a rod-like electrically conductive terminal (connection terminal) via a feeder portion (conductive layer). The connection between the connection terminal and the conductive layer is maintained under the condition where the connection terminal is pressed against the conductive layer. The heater is used to heat an object to be heated, such as a wafer, on the upper surface of the heat-equalizing plate.

In the heater disclosed in Patent Literature 1, however, since the connection between the connection terminal and the conductive layer is established by pressing the connection terminal against the conductive layer, it is difficult to achieve improvement in the long-term reliability of electrical connection between the connection terminal and the conductive layer. More specifically, there may be cases where a pressing force exerted between the connection terminal and the conductive layer varies under heat cycles. At this time, too great a pressing force may cause damage to the connection terminal or the conductive layer. On the other hand, too small a pressing force may cause a failure in maintaining the electrical connection between the connection terminal and the conductive layer.

The invention has been devised in view of the problem as discussed above, and accordingly an object thereof is to provide a heater capable of achieving improvement in long-term reliability of electrical connection between a connection terminal and a conductive layer.

SUMMARY OF INVENTION

According to one embodiment of the invention, a heater includes: a base body formed of ceramics; a heat generating resistor layer disposed on a surface of the base body; a conductive layer laminated on the heat generating resistor layer; a plate-like member which is disposed on the conductive layer and is provided with a pair of through holes; and a connection terminal composed of wires which are inserted successively through one of the pair of through holes and the other and are unified at a side of the plate-like member which side is opposite to a side of the plate-like member facing the conductive layer, the connection terminal being electrically connected with the conductive layer.

DESCRIPTION OF EMBODIMENTS

Figure 1:
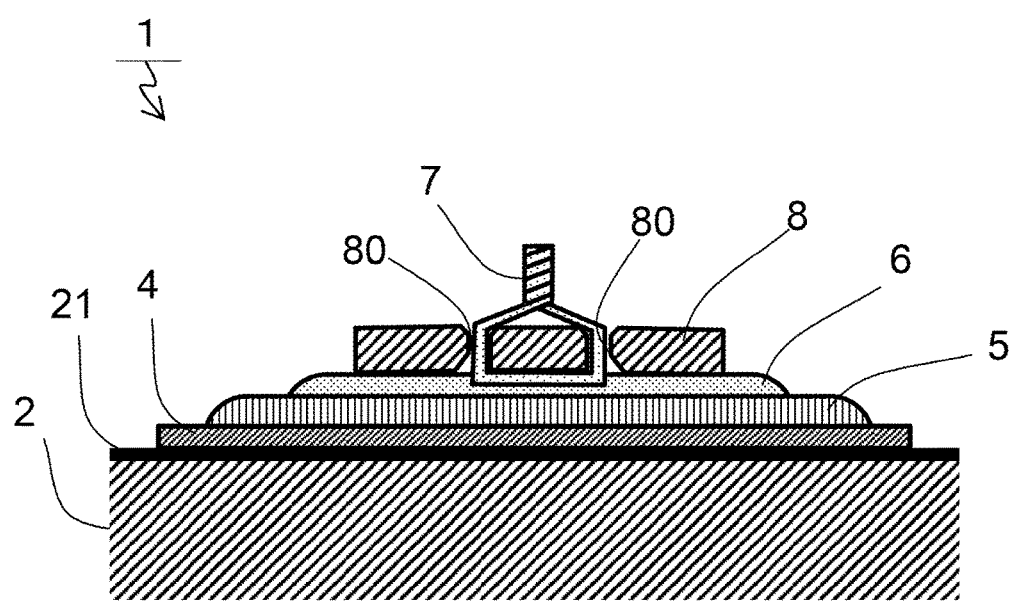
FIG. 1 is a fragmentary sectional view of the heater according to an embodiment.

Hereinafter, a heater 1 according to an embodiment will be described with reference to drawings. FIG. 1 is a fragmentary sectional view of the heater 1. The heater 1 according to the embodiment comprises a base body 2 formed of ceramics, an insulating layer 4 formed on the base body 2, a heat generating resistor layer 5 laminated on the insulating layer 4, a conductive layer 6 laminated on the heat generating resistor layer 5, and a connection terminal 7 connected to the conductive layer 6. The connection terminal 7 is mounted on the conductive layer 6 via a plate-like member 8.

Referring to FIG. 1, the structure of the base body 2 of the heater 1 according to the embodiment will be described in detail. In the heater 1 according to the embodiment, the base body 2 is formed of silicon carbide ceramics. One surface of the base body 2 constitutes a wafer placement face (not shown in the drawing). The surface of the base body 2, exclusive of the wafer placement face, is provided with a $SiO_2$ film 21 produced by heat treatment which is effected in an oxidizing atmosphere. On the $SiO_2$ film 21 is disposed the insulating layer 4 formed of glass. Moreover, on the insulating layer 4 is disposed the heat generating resistor layer 5 formed of gold (Au), platinum (Pt), or an alloy of gold and platinum. On the heat generating resistor layer 5 is disposed the conductive layer 6. For example, the conductive layer 6 is formed of a mixture of a metal material and a glass material. As the metal material used for the conductive layer 6, for example, gold is used. In a case where the conductive layer 6 is formed of a mixture of gold and a glass material, a glass paste with gold powder added is applied onto the heat generating resistor layer 5 by screen printing technique, with subsequent sintering being performed. In this way, the conductive layer 6 can be formed.

For example, the thickness of the $SiO_2$ film 21 preferably falls in the range of 0.05 to 2 μm, or more preferably falls in the range of 0.1 to 1 μm. In this case, the insulating layer 4 can be provided on the surface of the $SiO_2$ film 21 with high reliability. By designing the $SiO_2$ film 21 to have a thickness of greater than or equal to 0.05 μm, when a glass layer which becomes the insulating layer 4 is formed on the $SiO_2$ film 21, it is possible to avoid that the $SiO_2$ film 21 will be absorbed by the glass, and thereby form the insulating layer 4 so as to extend over the $SiO_2$ film 21 satisfactorily.

Moreover, by designing the $SiO_2$ film 21 to have a thickness of less than or equal to 2 μm, it is possible to suppress cristobalite-made crystalline phase augmentation in the $SiO_2$ film 21, and thereby minimize deterioration in adhesion between the insulating layer 4 and the $SiO_2$ film 21. From the standpoints of both of reliability and productivity, it is more preferable that the thickness of the $SiO_2$ film 21 falls in the range of 0.1 to 1 μm.

Moreover, the $SiO_2$ film 21 characterized by cristobalite-crystal growth reduction can be formed by polishing the surface of the base body 2 formed of silicon carbide ceramics until the planarity of the surface becomes 10 μm or below, subjecting the surface to an atmosphere of oxygen at 1200 to 1600° C. for 1 to 12 hours, and cooling the surface at a cooling rate of 200° C. or above per hour at least in a range downward from 1000 to 600° C.

The base body 2 may be formed of a ceramics material composed predominantly of one or more of silicon nitride, aluminum nitride, boron nitride, and boron carbide, instead of silicon carbide ceramics. In cases where the base body 2 is formed of insulating ceramics, there is no need to provide the insulating layer 4. Moreover, as the silicon carbide ceramics constituting the base body 2, use can be made of a ceramics material obtained by sintering silicon carbide, which is a major constituent, containing boron (B) and carbon (C) as sintering aids. As another example of the silicon carbide ceramics, use can be made of a ceramics material obtained by sintering silicon carbide, which is a major constituent, containing alumina ($Al_2O_3$) and yttria ($Y_2O_3$) as sintering aids. Such ceramics materials undergo sintering at temperatures ranging from 1900 to 2200° C. Moreover, as silicon carbide, either an α-SiC-based substance or a β-SiC-based substance may be used.

Moreover, as boron carbide ceramics, use can be made of a ceramics material obtained by sintering boron carbide, which is a major constituent, in admixture with carbon in an amount of 3 to 10% by mass as a sintering aid. This ceramics material undergoes sintering at temperatures ranging from 2000 to 2200° C.

Moreover, as boron nitride ceramics, use can be made of a ceramics material obtained by sintering boron nitride, which is a major constituent, in admixture with, as sintering aids, aluminum nitride in an amount of 30 to 45% by mass and rare earth element oxide in an amount of 5 to 10% by mass. This ceramics material undergoes sintering at temperatures ranging from 1900 to 2100° C.

Moreover, as silicon nitride ceramics, use can be made of a ceramics material obtained by sintering silicon nitride, which is a major constituent, in admixture with, as sintering aids, rare earth element oxide in an amount of 3 to 12% by mass and $Al_2O_3$ in an amount of 0.5 to 3% by mass, and also, $SiO_2$ in an amount determined so that a $SiO_2$ content in the ceramics falls in the range of 1.5 to 5% by mass. This ceramics material undergoes sintering at temperatures ranging from 1650 to 1750° C. As mentioned herein, the $SiO_2$ content refers to the sum total of the amount of $SiO_2$ produced from oxygen contained in a silicon nitride raw material, the amount of $SiO_2$ contained as impurities in other additives, and the amount of intentionally added $SiO_2$.

Moreover, as aluminum nitride ceramics, use can be made of a ceramics material obtained by sintering aluminum nitride, which is a major constituent, in admixture with, as sintering aids, rare earth element oxide such as $Y_2O_3$ or $Yb_2O_3$, and, on an as needed basis, alkaline earth metal oxide such as CaO. This ceramics material can be obtained by firing the constituents at 1900 to 2100° C. in the presence of nitrogen gas.

Such ceramics materials are used in a selective manner according to applications of the heater 1. For example, in the case of using the heater 1 to dry a resist film, the use of ceramics other than nitride ceramics is desirable. This makes it possible to suppress generation of ammonia gas which results from a reaction with moisture. Moreover, in the case of using the heater 1 for CVD applications where the heater 1 may be operated under high-temperature conditions, for example, at about 800° C., the use of ceramics other than boron nitride ceramics makes it possible to reduce the possibility of deformation of the base body 2 during the use of the heater 1.

It is preferable that the surface of the base body 2 exclusive of the wafer placement face is polished so that the planarity is less than or equal to 20 μm and the arithmetic average roughness Ra falls in the range of about 0.1 to 0.5 μm in the interest of enhancing the adhesion with the insulating layer 4 formed of glass or resin.

In the case of using silicon carbide ceramics for the base body 2, the base body 2 becomes somewhat electrically conductive, thus creating the need for the insulating layer 4. As the insulating layer 4 for maintaining insulation between the base body 2 and the heat generating resistor layer 5, for example, glass or resin may be used. In the case of using glass for the insulating layer 4, by setting its thickness to be greater than or equal to 30 μm, the insulating layer 4 can be adapted to a withstand voltage exceeding 1.5 kV, and is thus capable of ensuring insulation. Moreover, by setting the thickness of the glass-made insulating layer 4 to be less than or equal to 600 μm, it is possible to minimize the thermal stress developed between the insulating layer 4 and silicon carbide ceramics constituting the base body 2 or aluminum nitride ceramics. It is more preferable that the insulating layer 4 has a thickness of 100 to 350 μm.

The insulating layer 4 formed of glass or resin is adhered on base body 2 by applying adequate amounts of drops of a glass paste or a resin paste onto the central area of the base body 2 and then spreading the drops in a uniformly thick coating by spin-coating technique, or applying the paste evenly onto the base body 2 by screen printing, dipping, spray coating, or otherwise, and performing a sintering process. The glass paste undergoes sintering at a temperature of 600° C., and, the resin paste is cured at a temperature of 300° C. or above. Moreover, in the case of using glass for the insulating layer 4, it is advisable to heat the base body 2 formed of silicon carbide ceramics or boron carbide ceramics at a temperature of about 1200° gC. in advance for oxidation treatment on the surface of the base body 2 where the insulating layer 4 is to be adhered. This makes it possible to enhance the adherability of the glass-made insulating layer 4 to the base body 2.

The heat generating resistor layer 5 is a member configured to produce heat under voltage application. The heat generating resistor layer 5 is disposed on the surface of the base body 2, with the insulating later 4 lying between them. Application of a voltage to the heat generating resistor layer 5 causes the flow of electric current, whereupon the heat generating resistor layer 5 produces heat. The heat thus produced is transmitted through the interior of the base body 2, thus subjecting the wafer placement face of the base body 2 to a high temperature. Then, the heat is transmitted from the wafer placement face of the base body 2 to an object to be heated. The heater 1 functions in this way.

The heat generating resistor layer 5, which is adhered on the insulating layer 4, is obtained by adhering a single metal material such as gold (Au), silver (Ag), copper (Cu), or palladium (Pd) directly on the insulating layer 4 by vapor deposition or plating, or a step of printing a resin paste or a glass paste containing oxide such as rhenium oxide ($Re_2O_3$) or lanthanum manganate ($LaMnO_3$) as an electrically conductive material in a predetermined pattern onto the insulating layer 4 by screen printing or otherwise, and performing a sintering process.

Moreover, it is preferable that the heat generating resistor layer 5 contains glass to enhance its adhesion with the insulating layer 4, and that the softening point of the glass is lower than the transition point of glass contained in the insulating layer 4. This makes it possible to attain higher precision in machining the heat generating resistor layer 5.

Glass is considered to have the form of a viscous fluid of high viscosity at a temperature of higher than or equal to the transition point. Accordingly, by setting the softening point of glass contained in the heat generating resistor layer 5 to be lower than the transition point of glass contained in the insulating layer 4, it is possible to reduce the influence exerted on the insulating layer 4 acting as a base material during the process of sintering the heat generating resistor layer 5.

In defining a pattern in the heat generating resistor layer 5, for example, a substantially concentric pattern composed of arcuate electrode portions and rectilinear electrode portions or a volute pattern may be adopted. The heat generating resistor layer 5 may be divided into a plurality of patterns for improvement in thermal uniformity. Moreover, as the material constituting the heat generating resistor layer 5, use can be made of, for example, gold, silver, palladium, or platinum-group metal. Moreover, on an as needed basis, the heat generating resistor layer 5 may be subjected to trimming for improvement in thermal uniformity.

The plate-like member 8 is a member configured to maintain the connection between the connection terminal 7 and the heat generating resistor layer 5. The plate-like member 8 is provided with a pair of through holes 80 formed therethrough vertically. For example, the plate-like member is a member shaped in a circular plate. The plate-like member 8 is disposed on the conductive layer 6. The plate-like member 8 is formed of a ceramic material such for example as silicon carbide, silicon nitride, aluminum nitride, or alumina. The placement of the ceramic-made plate-like member 8 on the conductive layer 6 makes it possible to reduce thermal expansion occurring in the conductive layer 6 sandwiched between the plate-like member 8 and the base body 2, and thereby increase the long-term reliability of the heater 1.

Moreover, it is preferable that the conductive layer 6, which is predominantly composed of precious metal such as Au or Ag, further contains a glass component. With the content of a glass component, the conductive layer 6 becomes softer and is thus capable of absorbing thermal stress readily. As a result, the heat generating resistor layer 5 can be less prone to be subjected to thermal stress concentration, thus achieving improvement in the long-term reliability of the heater 1.

The connection terminal 7 is a member configured to provide electrical connection between the heat generating resistor layer and an external power supply. For example, the connection terminal 7 is composed of metal-made wires such as gold wires, nickel wires, or copper wires. The connection terminal 7 is drawn successively through one of the pair of through holes 80 of the plate-like member 8 and the other, and is electrically connected to the conductive layer 6 in a region between the conductive layer 6 and the plate-like member 8. In the connection terminal 7, the wires are unified at a side of the plate-like member 8 which side is opposite to a side of the plate-like member 8 facing the conductive layer 6. That is, the wires are drawn successively through one of the pair of through holes 80 and the other, and the portions of the wires drawn out of the plate-like member 8 are fixedly joined together.

Moreover, the connection terminal 7 may be formed of gold, and, the base body 2 and the plate-like member 8 may be formed of silicon carbide. In this case, for example, the connection terminal 7 exhibits a thermal conductivity of 320 W/(m·k), and, each of the base body 2 and the plate-like member 8 exhibits a thermal conductivity of 200 W/(m·k), that is; the connection terminal 7 is greater in thermal conductivity than the base body 2 and the plate-like member 8. The placement of the plate-like member 8 on the base body 2 causes a local increase in heat capacity. Therefore, when the base body 2 is subjected to the raising and lowering of temperature, a part of the base body 2 joined to the plate-like member 8 requires longer time to reach a predetermined temperature than does other part, which results in the possibility of deterioration in transient characteristics. In this regard, as described above, when using a member which is greater in thermal conductivity than the base body 2 and the plate-like member 8 as the connection terminal 7, it is possible to facilitate dissipation of heat from the connection terminal 7, and thereby restrain heat from filling in the plate-like member 8.

In the heater 1 according to the embodiment, the connection terminal 7 is composed of wires. The wires are inserted successively through one of the pair of through holes 80 and the other, and are unified at the side of the plate-like member 8 which side is opposite to the side of the plate-like member 8 facing the conductive layer 6, and are electrically connected to the conductive layer 6. Thus, by construction of the connection terminal 7 from the wires, it is possible to reduce occurrence of damage to the conductive layer 6 under heat cycles. Moreover, since the wires are inserted successively through one of the pair of through holes 80 and the other, and are unified at the side of the plate-like member 8 which side is opposite to the side of the plate-like member 8 facing the conductive layer 6, it is possible to reduce the possibility of separation of the wire from the conductive layer 6 under the tensile stress developed during heat cycles, and thereby achieve improvement in the reliability of electrical connection between the connection terminal 7 and the conductive layer 6.

For example, stranded wire may be used for the connection terminal 7. More specifically, in the heater 1 according to the embodiment, the connection terminal 8 is composed of strands of 35 gold threads. The use of strands of 10 or more threads for the connection terminal 8 makes it possible to enhance the durability of the connection terminal 8.

Moreover, in the connection terminal 7, the wire portions drawn out of the pair of through holes 80 of the plate-like member 8 are twisted together in one piece. Since the wire portions of the connection terminal 7 led out over the plate-like member 8 are fixedly joined together, it is possible to minimize deterioration of the flexibility of the connection terminal 7. Moreover, since strands of a plurality of wires constitute the connection terminal 7, it follows that the connection terminal 7 exhibits high strength against tensile stress, expressed differently, exhibits high tensile strength. Thus, the long-term reliability of the heater 1 can be increased. Moreover, examples of means for fixedly joining together the wire portions led out over the plate-like member 8 include soldering, spot welding, and the use of an adhesive. As the adhesive, for example, a resin adhesive such as an epoxy resin adhesive may be used.

Figure 2:
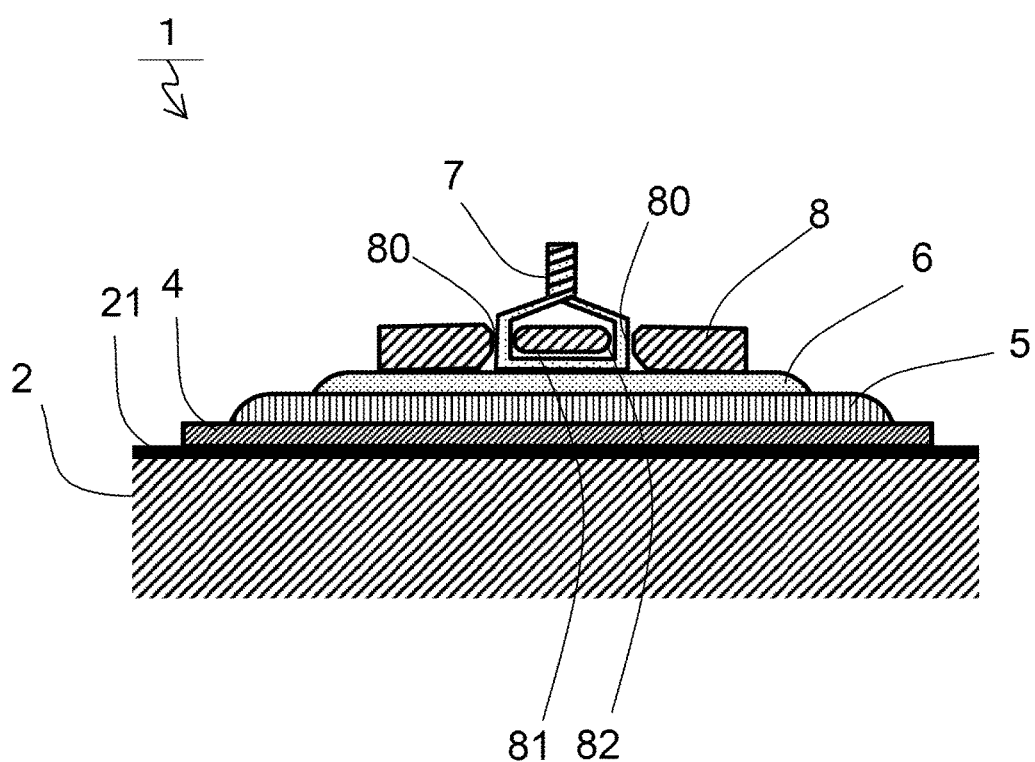
FIG. 2 is a fragmentary sectional view showing a modified example of the heater shown in FIG. 1.

Moreover, as shown in FIG. 2, it is preferable that a face located on the side of the plate-like member 8 facing the conductive layer 6 is provided with a groove 81 extending across the pair of through holes 80, and that the wire portion of the connection terminal 7 situated between the conductive layer 6 and the plate-like member 8 is placed in the groove 81. In a case where the conductive layer 6-side face of the plate-like member 8 is made flat, the possibility arises that due to the interposition of the connection terminal 7 between the plate-like member 8 and the conductive layer 6 the plate-like member 8 will be lifted from the conductive layer 6. In this case, the adhesion between the plate-like member 8 and the conductive layer 6 may be impaired. In this regard, with the construction in which the wire portion of the connection terminal 7 situated between the conductive layer 6 and the plate-like member 8 is placed in the groove 81, while the connection terminal 7 is sandwiched between the plate-like member 8 and the conductive layer 6, a groove 81-free region of the plate-like member 8 can be readily brought into contact with the conductive layer 6. This makes it possible to enhance the adhesion between the conductive layer 6 and the plate-like member 8, and thereby enhance the durability of the heater 1.

Moreover, as shown in FIG. 2, it is preferable that corners located between the respective through holes 80 and the groove 81 in the plate-like member 8 are each provided with a chamber 82. This makes it possible to reduce the possibility of occurrence of a break at the corner of the wire-made connection terminal 7. Note that the chamfer 82 refers to a portion obtained by cutting off part of the corner to provide a beveled or curved surface.

The groove 81 may be so designed that its width is greater than its depth. In this case, in the connection terminal 7 about to undergo thermal expansion within the groove 81, the connection terminal 7 is thermally expanded mainly in the direction of width of the groove 81. In other words, the depthwise thermal expansion of the connection terminal 7 can be reduced. This makes it possible to reduce the stress developed in the connection terminal 7 in a state of being sandwiched between the plate-like member 8 and the base body 2.

The through hole 80 may be designed to have a diameter of 0.4 to 1 mm, for example. The groove 81 may be designed to have a width of 0.6 to 1.5 mm, for example, and a depth of 0.4 to 1 mm, for example.

Figure 3:
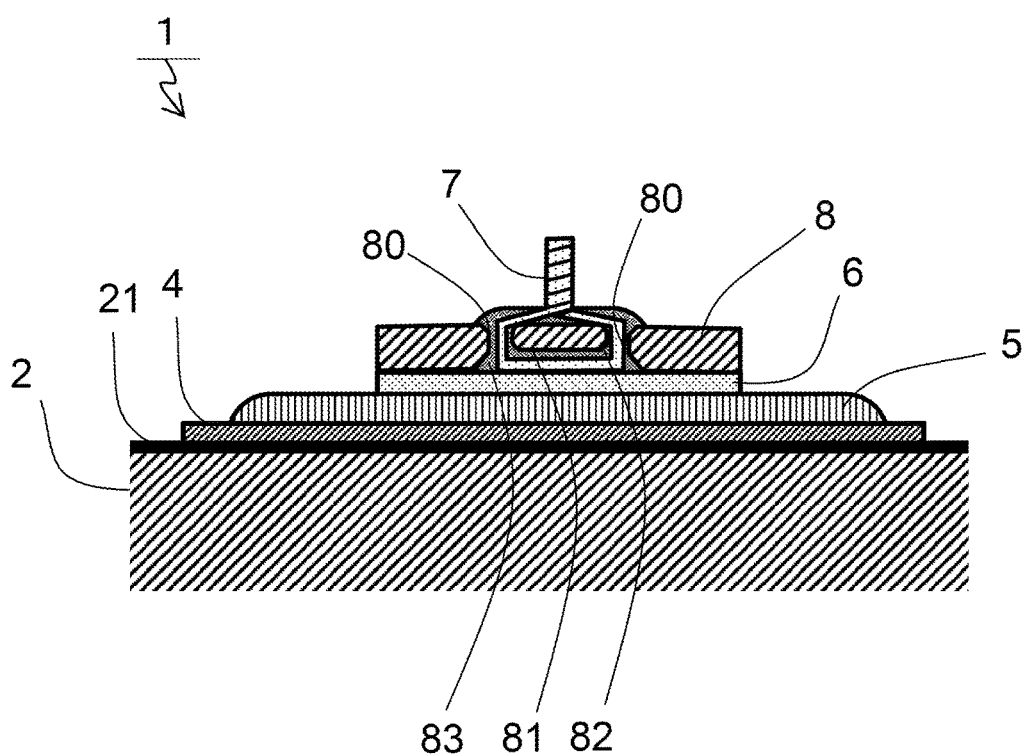
FIG. 3 is a fragmentary sectional view showing a modified example of the heater shown in FIG. 1.

Moreover, as shown in FIG. 3, it is preferable that the pair of through holes 80 are each internally provided with a conductive adhesive 83. By virtue of the conductive adhesive, the connection terminal 7 can be held securely, thus reducing the possibility of separation of the connection terminal 7 from the conductive layer 6. In consequence, the long-term reliability of the heater 1 can be increased. As the conductive adhesive, for example, use can be made of a paste predominantly composed of precious metal such as gold or silver. It is particularly desirable to use a paste containing a glass component in view of the strength of adhesion with the conductive layer 6. This makes it possible to permit bonding of the conductive layer 6 with the glass component of the conductive adhesive, and thereby increase the adhesion strength.

Moreover, it is desirable to put the conductive adhesive 83 not only inside the pair of through holes 80 but also inside the groove 81. This makes it possible to achieve further improvement in the reliability of connection between the connection terminal 7 and the conductive layer 6.

Moreover, as shown in FIG. 3, it is preferable that the conductive adhesive 83 extends over a region around the through hole 80 on the surface of the side of the plate-like member 8 which side is opposite to the side of the plate-like member 8 facing the conductive layer 6. This makes it possible to increase the area of contact between the conductive adhesive 83 and the connection terminal 7, and thereby hold the connection terminal 7 more securely.

Moreover, as shown in FIG. 3, it is preferable that the plate-like member 8 covers the conductive layer 6. In this case, the entire conductive layer 6 can be sandwiched between the plate-like member 8 and the base body 2, thus achieving further reduction in the thermal expansion occurring in the conductive layer 6.

EXAMPLES

The heater 1 according to the embodiment will be described in detail using an example. The heater 1 shown in FIG. 1 was produced in the following manner. To begin with, 3% by mass $B_4C$ and 2% by mass carbon were admixed in a silicon carbide raw material with adequate amounts of binder and solvent, and the admixture was subjected to granulation, whereafter resultant granules were shaped into a molded body under a compacting pressure set at 100 MPa. Subsequently the molded body has been fired at temperatures ranging from 1900 to 2100° C. In this way, there was obtained a base body 2 in circular plate form which is 80 W/(m·k) in thermal conductivity, 340 mm in outer diameter, and 3 mm in thickness. After performing surface grinding on each principal face of the base body 2, heat treatment has been effected thereon at 1100° C. for 1 hour, whereafter a $SiO_2$ film 21 was formed. On the $SiO_2$ film 21 was formed a 300 μm-thick insulating layer 4 formed of glass.

Next, in order to adhere the heat generating resistor layer 5 on the insulating layer 4, a glass paste with Au powder and Pd powder added as electrically conductive materials was printed in a predetermined pattern by screen printing technique. Then, after drying organic solvent under application of heat at 150° C., degreasing treatment has been performed at 550° C. for 30 minutes, whereafter baking has been effected at temperatures ranging from 700 to 900° C. In this way, a 50 μm-thick heat generating resistor layer 5 was formed.

Next, in order to mold the plate-like member 8, 3% by mass $B_4C$ and 2% by mass carbon were admixed in a silicon carbide raw material with adequate amounts of binder and solvent, and a resultant admixture was subjected to granulation, whereafter resultant granules were shaped into a molded body under a compacting pressure set at 100 MPa. Subsequently the molded body has been fired at temperatures ranging from 1900 to 2100° C. In this way, there was obtained a plate-like member 8 which is 80 W/(m·k) in thermal conductivity, 4 mm in length, 4 mm in width, and 1.2 mm in thickness.

A pair of 0.65 mm-diameter through holes 80 was formed at a center of the plate-like member 8 thus obtained. After performing surface grinding on each principal face of the plate-like member 8, heat treatment has been effected at 1100° C. for 1 hour, and a $SiO_2$ film was formed. Then, the wire-made connection terminal 7 was drawn through the through holes 80, and, the wire ends drawn out of the through holes 80 were fixedly twisted together. As the wire, a 0.5 mm-diameter gold wire was used.

Next, a glass paste containing an organic solvent with Au powder added as electrically conductive materials was printed in a circular pattern onto the heat generating resistor layer 5 by the screen printing technique to form a conductive layer 6. Then, the thereby obtained plate-like member 8 was mounted on the conductive layer 6. After drying the organic solvent under application of heat at 150° C., degreasing treatment has been performed at 550° C. for 30 minutes, whereafter baking has been effected at temperatures ranging from 700 to 900° C. In this way, the plate-like member 8 was joined to the conductive layer 6.

In the manner as described above, the heater 1 was produced. In the thereby obtained heater 1, the strength of the connection terminal 7 against tensile stress was measured by a push-pull gauge. As the result of 10 measurements, a strength value of greater than or equal to 100 N was obtained in each and every measurement. Moreover, in any of the cases when fracture took place, a starting point of cracking resided in the interface between the conductive layer 6 and the plate-like member 8.

As a comparative example, there was produced another heater devoid of the plate-like member in which the wire-made connection terminal was joined to the conductive layer. The comparative example is similar in structure to the heater of the example as described above except that the plate-like member is not used. Also in the heater of the example, the strength of the connection terminal against tensile stress was measured by a push-pull gauge. As the result of ten measurements, a strength value of less than or equal to 10 N was obtained in each and every measurement. Furthermore, in any of the cases when fracture took place, a starting point of cracking resided in the interface between the connection terminal and the conductive layer.

It has been confirmed from the foregoing results that the application of the construction according to the embodiment makes it possible to achieve improvement in the long-term reliability of connection between the connection terminal 7 and the conductive layer 6.

REFERENCE SIGNS LIST

1: Heater
2: Base body
4: Insulating layer
5: Heat generating resistor layer
6: Conductive layer
7: Connection terminal
8: Plate-like member
80: Through hole
81: Groove
82: Chamfer
83: Conductive adhesive
21: SiO$_2$ film

The invention claimed is:

1. A heater, comprising:
   a base body formed of ceramics;
   a heat generating resistor layer disposed on a surface of the base body;
   a conductive layer laminated on the heat generating resistor layer;
   a plate-like member which is disposed on the conductive layer and is provided with a pair of through holes; and
   a connection terminal composed of wires which are inserted successively through one of the pair of through holes and the other and are unified at a side of the plate-like member which side is opposite to a side of the plate-like member facing the conductive layer, the connection terminal being electrically connected with the conductive layer,
   wherein a face located on the side of the plate-like member facing the conductive layer is provided with a groove extending across the pair of through holes, and
   portions of the wires of the connection terminal located between the conductive layer and the plate-like member are placed in the groove.

2. The heater according to claim 1,
   wherein the plate-like member is formed of ceramics.

3. The heater according to claim 1,
   wherein the connection terminal is constructed by twisting the wires together in one piece.

4. The heater according to claim 1,
   wherein corners located between the respective through holes and the groove in the plate-like member are each provided with a chamfer.

5. The heater according to claim 1,
   wherein the pair of through holes are each internally provided with a conductive adhesive.

6. The heater according to claim 1,
   wherein the pair of through holes and the groove are each internally provided with a conductive adhesive.

7. The heater according to claim 5,
   wherein the conductive adhesive extends over a region around the pair of through holes on a surface of the side of the plate-like member which side is opposite to the side of the plate-like member facing the conductive layer.

8. The heater according to claim 1,
   wherein the plate-like member covers the conductive layer.

9. A heater, comprising:
   a base body formed of ceramics;
   a heat generating resistor layer disposed on a surface of the base body;
   a conductive layer laminated on the heat generating resistor layer;
   a plate-like member which is disposed on the conductive layer and is provided with a pair of through holes; and
   a connection terminal composed of wires which are inserted successively through one of the pair of through holes and the other and are unified at a side of the plate-like member which side is opposite to a side of the plate-like member facing the conductive layer, the connection terminal being electrically connected with the conductive layer,
   wherein the pair of through holes are each internally provided with a conductive adhesive, and
   the conductive adhesive extends over a region around the pair of through holes on a surface of the side of the plate-like member which side is opposite to the side of the plate-like member facing the conductive layer.

* * * * *